United States Patent
Zhang et al.

(10) Patent No.: US 11,742,316 B2
(45) Date of Patent: Aug. 29, 2023

(54) INTERCONNECT STRUCTURE FOR SEMICONDUCTOR WITH ULTRA-FINE PITCH AND FORMING METHOD THEREOF

(71) Applicant: GUANGDONG UNIVERSITY OF TECHNOLOGY, Guangzhou (CN)

(72) Inventors: Yu Zhang, Guangzhou (CN); Chengqiang Cui, Guangzhou (CN); Peilin Liang, Guangzhou (CN); Jin Tong, Guangzhou (CN); Guannan Yang, Guangzhou (CN)

(73) Assignee: GUANGDONG UNIVERSITY OF TECHNOLOGY, Guangzhou (CN)

( * ) Notice: Subject to any disclaimer, the term of this patent is extended or adjusted under 35 U.S.C. 154(b) by 0 days.

(21) Appl. No.: 17/897,086

(22) Filed: Aug. 26, 2022

(65) Prior Publication Data
US 2022/0415846 A1 Dec. 29, 2022

Related U.S. Application Data

(63) Continuation of application No. PCT/CN2022/072575, filed on Jan. 18, 2022.

(30) Foreign Application Priority Data

Jun. 15, 2021 (CN) .......................... 202110661954.7

(51) Int. Cl.
*H01L 23/00* (2006.01)

(52) U.S. Cl.
CPC .............. *H01L 24/81* (2013.01); *H01L 24/11* (2013.01); *H01L 24/16* (2013.01);
(Continued)

(58) Field of Classification Search
CPC ......... H01L 24/81; H01L 24/11; H01L 24/16; H01L 2224/11015; H01L 2224/1181;
(Continued)

(56) References Cited

U.S. PATENT DOCUMENTS

| 9,865,527 B1 | 1/2018 | Cook et al. |
| 2002/0127825 A1 | 9/2002 | Mui et al. |

(Continued)

FOREIGN PATENT DOCUMENTS

| CN | 102142362 A | 8/2011 | |
| CN | 107470609 A * | 12/2017 | ............ B22F 1/0025 |

(Continued)

OTHER PUBLICATIONS

Gracia-Pinilla M, Martínez E, Vidaurri GS, Pérez-Tijerina E. Deposition of Size-Selected Cu Nanoparticles by Inert Gas Condensation. Nanoscale Res Lett. Nov. 6, 2009;5(1):180-188. (Year: 2009).*

(Continued)

*Primary Examiner* — Nduka E Ojeh
*Assistant Examiner* — Laura M Dykes

(57) ABSTRACT

This application relates to semiconductor manufacturing, and more particularly to an interconnect structure for semiconductors with an ultra-fine pitch and a forming method thereof. The forming method includes: preparing copper nanoparticles using a vapor deposition device, where coupling parameters of the vapor deposition device are adjusted to control an initial particle size of the copper nanoparticles; depositing the copper nanoparticles on a substrate; invertedly placing a chip with copper pillars as I/O ports on the substrate; and subjecting the chip and the substrate to hot-pressing sintering to enable the bonding.

10 Claims, 1 Drawing Sheet

(52) U.S. Cl.
CPC .............. *H01L 2224/11015* (2013.01); *H01L 2224/1181* (2013.01); *H01L 2224/16227* (2013.01); *H01L 2224/81007* (2013.01); *H01L 2224/81055* (2013.01); *H01L 2224/8184* (2013.01); *H01L 2224/81203* (2013.01); *H01L 2224/81207* (2013.01); *H01L 2224/81224* (2013.01); *H01L 2224/81911* (2013.01); *H01L 2924/381* (2013.01); *H01L 2924/3841* (2013.01)

(58) Field of Classification Search
CPC . H01L 2224/16227; H01L 2224/81007; H01L 2224/81055; H01L 2224/81203; H01L 2224/81207; H01L 2224/81224; H01L 2224/8184; H01L 2224/81911; H01L 2924/381; H01L 2924/3841
USPC .......................................................... 438/613
See application file for complete search history.

(56) References Cited

U.S. PATENT DOCUMENTS

| | | | |
|---|---|---|---|
| 2005/0006754 A1 | 1/2005 | Arik | |
| 2008/0286488 A1* | 11/2008 | Li | H01B 1/026 427/559 |
| 2012/0025365 A1 | 2/2012 | Haba | |
| 2014/0077351 A1 | 3/2014 | Haba | |
| 2014/0183716 A1 | 7/2014 | Zommer | |
| 2016/0351529 A1* | 12/2016 | Brunschwiler | H01L 24/08 |
| 2017/0309549 A1 | 10/2017 | Wachtler et al. | |
| 2018/0182693 A1* | 6/2018 | Cook | H01L 23/3121 |
| 2019/0109084 A1* | 4/2019 | Brunschwiler | H01L 24/16 |
| 2021/0005537 A1* | 1/2021 | Wachtler | H01L 23/49572 |

FOREIGN PATENT DOCUMENTS

| | | | | |
|---|---|---|---|---|
| CN | 108091633 A | | 5/2018 | |
| CN | 109317859 A | * | 2/2019 | ........... B23K 35/302 |
| CN | 110349871 A | | 10/2019 | |
| CN | 110970314 A | | 4/2020 | |
| CN | 111586988 A | | 8/2020 | |
| CN | 111607811 A | | 9/2020 | |
| CN | 112053973 A | * | 12/2020 | ............. B23K 26/38 |
| CN | 212259467 U | | 12/2020 | |
| CN | 112317972 A | * | 2/2021 | ............. B23K 26/38 |
| CN | 113488399 A | | 10/2021 | |
| KR | 2022018842 A | * | 2/2022 | |

OTHER PUBLICATIONS

Yanlan Wang et al., In-situ Preparation of Carbon Nanotubes Array Confined with Copper Azide, "Chinese Journal of Energetic Materials", 2016, vol. 24 (No. 04), pp. 386-392, Nationnal Key Laboratory of Appled Physics and Chemistry, Shannxi Applied Physics and Chemistry Research Institute, Xi'an 710061, China.

* cited by examiner

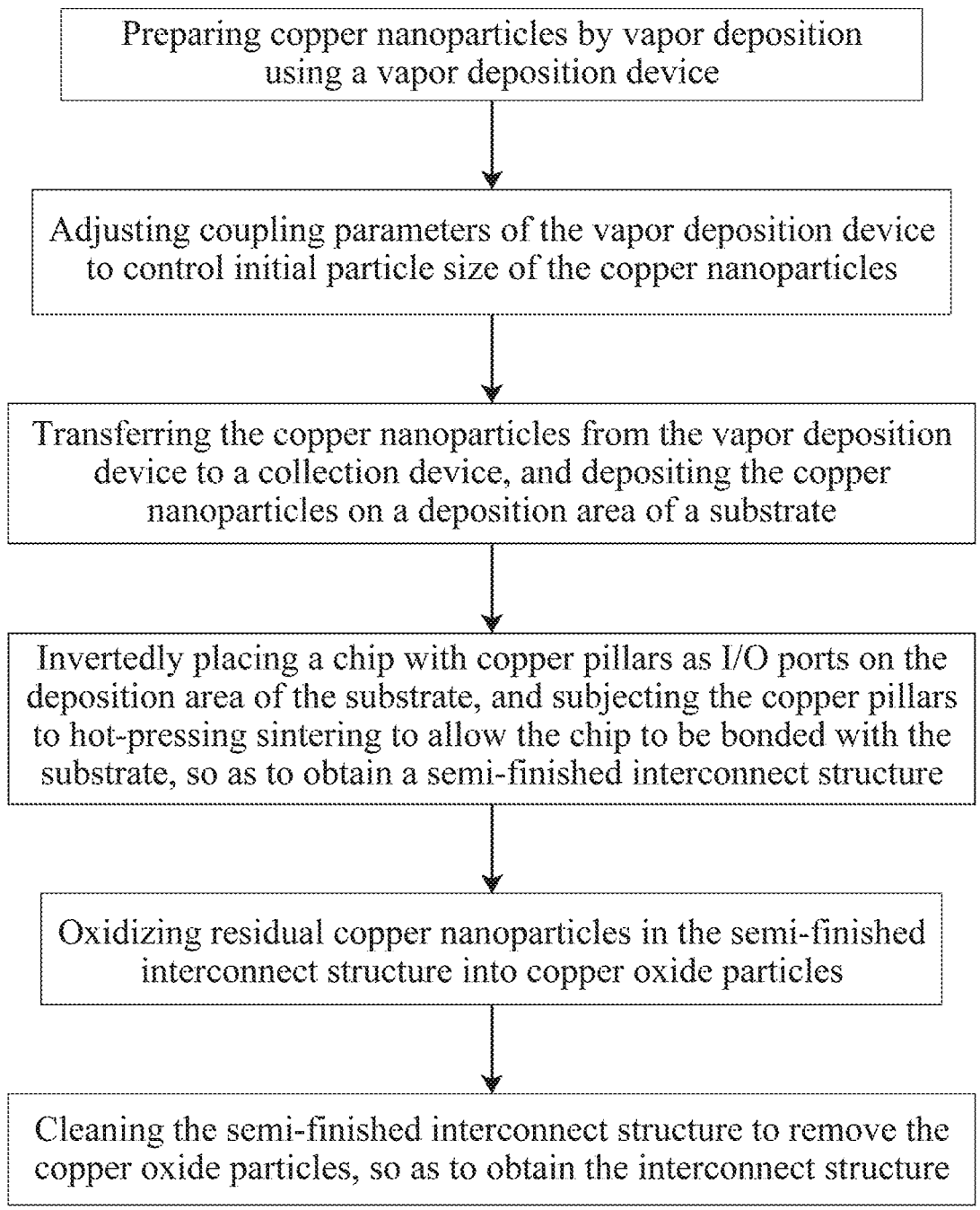

INTERCONNECT STRUCTURE FOR SEMICONDUCTOR WITH ULTRA-FINE PITCH AND FORMING METHOD THEREOF

CROSS-REFERENCE TO RELATED APPLICATIONS

This application is a continuation of International Patent Application No. PCT/CN2022/072575, filed on Jan. 18, 2022, which claims the benefit of priority from Chinese Patent Application No. 202110661954.7, filed on Jun. 15, 2021. The content of the aforementioned application, including any intervening amendments thereto, is incorporated herein by reference in its entirety.

TECHNICAL FIELD

This application relates to semiconductor manufacturing, and more particularly to an interconnect structure for semiconductors with an ultra-fine pitch and a forming method thereof.

BACKGROUND

As the electronic devices are heading for the miniaturization and intelligence, the manufacturing of integrated circuits has been challenged by the 20/14-nm technology node, and the corresponding flip-chip interconnection bumps will be reduced from 40-50 μm to 5 μm. Regarding the conventional lead-free solder bumping technology, the spacing between the solder balls is generally required to be relatively larger to achieve precise alignment with the pads on the circuit board. However, the relatively larger spacing limits the number of I/O (Input/Output) ports of the electronic devices, thereby severely restricting the development of the high-density packaging. In view of this, the lead-free solder bumps are gradually replaced with copper pillars, which can not only avoid the solder bridging during the reflow soldering, but also improve the interconnection strength between the chip and the substrate. The new-generation copper pillar bumps-based interconnection technology has played a significant role in enabling the ultra-fine-pitch interconnection and high-density three-dimensional packaging of next-generation chips due to the satisfactory electrical conductivity, heat conduction and electromigration resistance, and excellent reliability.

Although the copper-pillar bumping technology is promising in the ultra-fine pitch packaging and interconnection, the copper pillars will cause high interconnection temperature and poor alignment between the ultra-fine pitch semiconductor and the pad on the circuit board.

SUMMARY

An objective of this application is to provide an interconnect structure for semiconductors with an ultra-fine pitch and a forming method thereof, in which the ultra-fine pitch micro-copper pillars are invertedly placed on the nano-copper layer prepared by vapor deposition to achieve the low-temperature and low-pressure transient interconnection, improving the positioning accuracy between the chip and the substrate.

Technical solutions of this application are described as follows.

In a first aspect, this application provides a method for forming an interconnect structure for semiconductors with an ultra-fine pitch, comprising:

preparing copper nanoparticles by vapor deposition method using a vapor deposition device, wherein a coupling parameter of the vapor deposition device is adjusted to control an initial particle size of the copper nanoparticles;

transferring the copper nanoparticles from the vapor deposition device to a collection device; and depositing the copper nanoparticles in a deposition area of a substrate;

invertedly placing a chip with copper pillars as I/O ports on the deposition area of the substrate; and subjecting the copper pillars to hot-pressing sintering to allow the chip to be bonded with the substrate, so as to obtain a semi-finished interconnect structure;

oxidizing copper nanoparticles in areas not in contact with the copper pillars into copper oxide particles; and cleaning the semi-finished interconnect structure to remove the copper oxide particles, so as to obtain the interconnect structure.

In an embodiment, the transferring of the copper nanoparticles into from the vapor deposition device to the collection device is performed in a protective gas under the action of an external electric field. The protective gas is designed to protect the copper nanoparticles, and prevent the copper nanoparticles from oxidization, when the copper nanoparticles are transferred to the collection device. At the same time, if the protective gas is not fed into the vapor deposition device, the gas atmosphere in the vapor deposition device will greatly influence the size, shape and morphology of the copper nanoparticles, such that it is difficult to accurately control the quality of the copper nanoparticles transferred from the vapor deposition device, and obtain the interconnect structure for semiconductors with an ultra-fine pitch subsequently.

In an embodiment, the protective gas is nitrogen gas, argon gas or helium gas mixed with 5% or less of reducing gas; and the reducing gas is hydrogen gas, formaldehyde gas or carbon monoxide. The reducing gas is mixed to reduce the produced copper oxide particles, while avoiding the oxidation of the copper nanoparticles under high temperature.

In an embodiment, the initial particle size of the copper nanoparticles is smaller than 20 nm; and the protective gas is fed into the vapor deposition device at a flow rate of 0.5-5 L/min. The flow rate of the protective gas is determined by the vapor deposition device and the particle size of the copper nanoparticles to be prepared. In the vapor deposition method, the flow rate of the protective gas has a great impact on the particle size of the copper nanoparticles. If the flow rate of the protective gas is too high, a large loss of the copper nanoparticles is caused, and if the flow rate of the protective gas is too low, the agglomeration of the copper nanoparticles occurs, which will affect the subsequent sintering and bonding.

In an embodiment, the vapor deposition is performed by vacuum evaporation, magnetron sputtering, spark ablation-impacting deposition or ion planting. The initial particle size of the copper nanoparticles will be different according to different vapor deposition methods, which is suitable for interconnection with the chip with copper pillars of different pitches as I/O ports.

In an embodiment, the hot-pressing sintering is performed through a step of: under the exposure to heat, laser, electromagnetic wave or ultrasonic wave, pressing the chip and the substrate by a clamp in combination with sintering to enable bonding between the chip and the substrate.

In an embodiment, the copper nanoparticles are oxidized through exposure to an oxidative fluid; where the oxidative fluid is hot air, oxygen or hydrogen peroxide. In addition, the oxidization can be performed through a step of: subjecting the semi-finished interconnect structure to baking in an oven to oxidize the residual copper nanoparticles.

In an embodiment, the step of "cleaning the semi-finished interconnect structure to remove the copper oxide particles" is performed through steps of:

according to particle size of the copper nanoparticles deposited on the substrate and a thickness of a copper layer formed by deposition, cleaning the semi-finished interconnect structure with a 5%-10% (w/w) dilute sulfuric acid to remove the copper oxide particles from the deposition area of the substrate, and then with absolute ethyl alcohol to remove excess dilute sulfuric acid. A complete layer of nano-copper film is formed on the substrate by vapor deposition method. The nano-copper film covers both the interconnection I/O and the locations free of interconnection, without needing the conventional mask. The cleaning is to mainly remove the copper nanoparticles at the locations free of interconnection. If the copper nanoparticles at the locations free of interconnection is not cleaned, the conduction will occur between the interconnection and the locations free of interconnection, influencing the electrical performance of the chip. The cleaning is required to be performed without destroying the interconnection between the substrate and the ultra-fine pitch micron copper pillars, and during the cleaning, the excess nanoparticles are required to be fully oxidized and removed, which is difficult for the cleaning. Regarding the method provided herein, the semi-finished interconnect structure is cleaned fast, and dried to obtain the desired interconnect structure, allowing a high fabricating accuracy of the ultra-fine-pitch semiconductor and making the interconnect structure have better thermo-electric interconnection performance and reliability.

In a second aspect, this application provides an interconnect structure for semiconductors with an ultra-fine pitch, which is formed by the above-mentioned method.

Compared with the prior art, this application has the following beneficial effects.

With regard to the method provided herein for forming the interconnect structure for semiconductors with an ultra-fine pitch, the copper nanoparticles are prepared by vapor deposition, and the coupling parameters of the vapor deposition device are adjusted to control the particle size of the copper nanoparticles; the copper nanoparticles are deposited on the substrate, and then the chip with copper pillars as I/O ports is invertedly placed on the deposition area of the substrate; and then the chip and the substrate are bonded by heat-pressing sintering. In the method provided herein, the copper nanoparticles produced by the vapor deposition device has controllable particle size and high purity, and compared to the chemical preparation process, the vapor deposition is free of toxic and environmentally polluting chemical substances such as precursors, solvents and reducing agents, thereby avoiding the attenuation of the sintering performance caused by the organic residues and improving the device reliability. In addition, the method provided herein is suitable for any conductive materials including semiconductors due to its high flexibility, and can prevent the oxidization of the copper nanoparticles during the storage. Moreover, the positioning accuracy between the ultra-fine pitch chip and the substrate pad is greatly enhanced, and thus the high-density packaging and interconnection can be achieved.

BRIEF DESCRIPTION OF THE DRAWINGS

The FIGURE is a flowchart of a forming method according to an embodiment of this disclosure.

DETAILED DESCRIPTION OF EMBODIMENTS

This application will be described in detail below with reference to the embodiments and accompanying drawings.

Example 1

Referring to an embodiment shown in the FIGURE, a method was provided for forming an interconnect structure for semiconductors with an ultra-fine pitch, which was performed as follows.

Copper nanoparticles were prepared by vapor deposition via a vapor deposition device, where coupling parameters of the vapor deposition device were adjusted to control an initial particle size of the copper nanoparticles.

The copper nanoparticles were transferred from the vapor deposition device to a collection device, and were deposited in a deposition area of a substrate.

A chip with copper pillars as I/O ports was invertedly placed on the deposition area of the substrate; and the copper pillars were subjected to hot-pressing sintering to allow the chip to be bonded with the substrate, so as to obtain a semi-finished interconnect structure.

Residual copper nanoparticles in the semi-finished interconnect structure were oxidized into copper oxide particles.

The semi-finished interconnect structure was cleaned to remove the copper oxide particles, so as to obtain the interconnect structure for the semiconductors with an ultra-fine pitch.

Example 2

Provided herein was a method for forming an interconnect structure for semiconductors with an ultra-fine pitch, which was performed as follows.

(S1) Copper nanoparticles were prepared by a spark ablation device.

(S2) The voltage and current at two ends of electrodes of the spark ablation device were set to 1.2 kV and 10 mA, respectively, and an airflow velocity in the spark ablation device was set to 5 L/min to control the initial size of the copper nanoparticles to be 2-5 nm.

(S3) Nitrogen gas (99.999% purity) was fed into the spark ablation device to not only replace air in a preparation chamber of the spark ablation device, but also be taken as a medium to reduce the breakdown voltage between two ends of the electrode in the spark ablation device. At the same time, the copper nanoparticles were deposited on a deposition area of a substrate through an impacting system in a collection device, and the supply of nitrogen gas was stopped until the whole deposition process was completed, where a spacing between an impacting nozzle and the substrate was 1 mm; and a deposited nano-copper layer had a thickness of 0.2 μm.

(S4) A chip with copper pillars (a pitch of the copper pillars was 5 μm) was absorbed and transferred via a vacuum pad, and then invertedly placed on the deposition area of the substrate.

(S5) An interconnection region between the copper pillars and the substrate was subjected to scanning and heating to 180° C. using laser with a wavelength of 355 nm, a frequency of 150 KHz, a power of 0.16 W and a speed of 100-200 mm/s. The chip was pressurized to 0.5 MPa by a clamp in combination with ultrasonication to realize the fast bonding.

(S6) After the bonding was completed, the whole packaging structure was subjected to oxidation in hot air or oxygen.

(S7) Considering that the particle size of the deposited copper nanoparticles was different from the thickness of the copper layer formed by hot-pressing sintering, the deposition area of the substrate was cleaned with 5%-10% (w/w) dilute sulfuric acid to remove residual copper oxide particles, and then washed with absolute ethyl alcohol to remove the excess dilute sulfuric acid solution and dried to produce an interconnect structure sample with satisfactory thermoelectric interconnection performance and reliability.

Example 3

Provided herein is a method for forming an interconnect structure for semiconductors with an ultra-fine pitch, which was performed as follows.

(S1) Copper nanoparticles were prepared via a vacuum evaporation device with electron beam as evaporation source.

(S2) A copper target material was bombarded with the electron beam under an inclination angle of 15°, where the electron beam had a spot diameter of 5 μm, and accelerated by an electric field of 10 Kv, so as to control the initial size of the copper nanoparticles to 10-20 nm.

(S3) The vacuum evaporation device was vacuumized to ensure a vacuum degree less than or equal to $10^{-6}$ Pa. Nitrogen gas (99.999% purity) gas was fed into the vacuum evaporation device to allow gaseous nanoparticles to be transported directionally to the substrate in a basically collision-free linear motion. The supply of nitrogen gas (99.999% purity) was stopped until the preparation was completed, where a distance between the evaporation source and the substrate was controlled to be 20 cm, and a thickness of the copper deposition layer was controlled to be 0.5 μm.

(S4) A chip with copper pillars (a pitch of the copper pillars was 20 μm) was attracted and transferred via electromagnetic control, and then the chip was invertedly placed on the deposition area of the substrate.

(S5) The substrate was heated to 120° C. via an electromagnetic wave radiation generated by an alternating electric field, and an electromagnetic wave wavelength was 103 MHz. At the same time, 220V, 50 Hz of alternating current was applied along a vertical direction of the chip to assist sintering, and the chip was pressurized to 1 MPa using a clamp.

(S6) After the bonding was completed, the residual copper nanoparticles in a packaging structure was subjected to oxidization in 5%-8% hydrogen peroxide.

(S7) Considering that the particle size of the deposited copper nanoparticles was different from the thickness of the copper layer formed by hot-pressing sintering, the deposition area of the substrate was cleaned with 5%-10% (w/w) dilute sulfuric acid to remove residual copper oxide particles, and then washed with absolute ethyl alcohol to remove the excess dilute sulfuric acid solution and dried to produce an interconnect structure sample with satisfactory thermoelectric interconnection performance and reliability.

Example 4

Provided herein was a method for forming an interconnect structure for semiconductors with an ultra-fine pitch, which was performed as follows.

(S1) Copper nanoparticles were prepared by magnetron sputtering.

(S2) A preparing device was vacuumized. A copper target material was taken as a cathode target, and a substrate was taken as an anode. A vacuum chamber was fed with argon gas under 0.1-10 Pa to allow the argon gas to be ionized under electron collision to generate argon ion $Ar^+$. A copper target material was subjected to high-energy bombardment under direct-current negative high voltage of 1-3 kV or radio-frequency voltage of 13.56 MHz of the cathode target to generate glow discharge. The initial size of the copper nanoparticles was controlled to be 5-10 nm, and the supply of the argon gas was stopped, when a thickness of a copper deposition layer meets the requirements.

(S3) The ionized and evaporated copper nanoparticles were accelerated under an electric field of 10 Kv to allow the copper nanoparticles to be directionally deposited on the substrate, and the thickness of the copper deposition layer was 0.2 μm.

(S4) A chip with copper pillars (a pitch of the copper pillars was 10 μm) was transferred by a mechanical arm, and then the chip was invertedly placed on the deposition area of the substrate.

(S5) The substrate was heated to 180° C. via an ultrasonic hot-pressing furnace. The chip and the substrate were pressurized by an ultrasonic pressure probe under an ultrasonic power of 210 W and a pressure of 0.25 MPa, and then were subjected to heat preservation and sintering for 20 minutes.

(S6) After the bonding was completed, the interconnect structure was transferred to an oven and heated at 60° C. to oxidize the residual copper nanoparticles in the interconnect structure.

(S7) Considering that the particle size of the deposited copper nanoparticles was different from the thickness of the copper layer formed by hot-pressing sintering, the deposition area of the substrate was cleaned with 5%-10% (w/w) dilute sulfuric acid to remove residual copper oxide particles, and then washed with absolute ethyl alcohol to remove the excess dilute sulfuric acid solution and dried to produce an interconnect structure sample with satisfactory thermoelectric interconnection performance and reliability.

Example 5

Provided herein was a method for forming an interconnect structure for semiconductors with an ultra-fine pitch, which was performed as follows.

(S1) High-energy laser was taken as a heat source to prepare copper nanoparticles.

(S2) A preparing device was vacuumized. Nitrogen gas (99.999% purity) was fed into the preparing device to prevent the copper nanoparticles from being oxidized. A copper target material was subjected to heating via a pulsed laser under a wavelength of 308 nm, a pulse width of 20 ns, a pulse frequency of 20 Hz, and a power of 650 mJ, such that the copper target material was evaporated to generate high-temperature and high-pressure plasma. The initial size of the copper nanoparticles was controlled to be 10-20 nm.

(S3) The ionized and evaporated plasma was treated with laser to make the ionized and evaporated plasma directionally accelerated under an external electric field of 2 Kv, and then deposited on the substrate at an inclination angle of 30° to form a deposit thin film with a thickness of 1 μm.

(S4) A chip with copper pillars, where a pitch of the copper pillars was 30 μm, was absorbed and transferred by a vacuum pad, and then the chip was invertedly placed on the deposition area of the substrate.

(S5) An interconnection region between the copper pillars and the substrate was subjected to scanning and heating to 260° C. using laser with a wavelength of 355 nm, a frequency of 200 KHz, a power of 2.5 W and a speed of 50-100 mm/s. The chip was pressurized to 1 MPa by a clamp in combination with ultrasonication to realize the fast bonding.

(S6) After the bonding was completed, a whole packaging structure was subjected to oxidation in hot air/oxygen.

(S7) Considering that the particle size of the deposited copper nanoparticles was different from the thickness of the copper layer formed by hot-pressing sintering, the deposition area of the substrate was cleaned with 5%-10% (w/w) dilute sulfuric acid to remove residual copper oxide particles, and then washed with absolute ethyl alcohol to remove the excess dilute sulfuric acid solution and dried to produce an interconnect structure sample with satisfactory thermoelectric interconnection performance and reliability.

Example 6

Provided herein was a method for forming an interconnect structure for semiconductors with an ultra-fine pitch, which was performed as follows.

(S1) Copper nanoparticles were prepared by multi-arc ion plating method.

(S2) A vacuum chamber of the preparing system was vacuumized to a vacuum degree above $4 \times 10^{-3}$ Pa. A copper target material was taken as an anode, and a silicon substrate was taken as a cathode. A negative voltage of 1-5 kV was applied between the anode and the cathode to enable an arc discharge between the anode and the cathode with the argon gas taken as a medium. The argon gas was ionized to generate argon ion $Ar^+$. Under a discharge electric field, the argon ion $Ar^+$ was attracted due to the negative voltage of the cathode to bombard a surface of the silicon substrate to clean the surface of the substrate. After the surface of the substrate was sufficiently cleaned, the supply of the argon gas was stopped.

(S3) An alternating-current power supply of an evaporation source is turned on to allow the copper target material vaporized and evaporated, and then collide with argon atoms and argon ions. The initial size of the copper nanoparticles was controlled to be 10-20 nm. At the same time, the copper nanoparticles were deposited on the surface of the silicon substrate to form a nano-copper film under a negative high-voltage electric field, such that a thickness of the nano-copper film is 0.5 μm.

(S4) A chip with copper pillars, where a pitch of the copper pillars was 15 was transferred by a mechanical arm, and then the chip was invertedly placed on the deposition area of the substrate.

(S5) The substrate was heated to 180° C. via an ultrasonic hot-pressing furnace. The chip and the substrate were pressurized by an ultrasonic pressure probe under an ultrasonic power of 210 W, at 0.25 MPa, and then were subjected to heat preservation and sintering for 20 minutes.

(S6) After the bonding was completed, the interconnect structure was put into an oven under 80° C. to oxidize the residual copper nanoparticles in the interconnect structure.

(S7) Considering that the particle size of the deposited copper nanoparticles was different from the thickness of the copper layer formed by hot-pressing sintering, the deposition area of the substrate was cleaned with 5%-10% (w/w) dilute sulfuric acid to remove residual copper oxide particles, and then washed with absolute ethyl alcohol to remove the excess dilute sulfuric acid solution and dried to produce an interconnect structure sample with satisfactory thermoelectric interconnection performance and reliability.

The interconnect structure for semiconductors with an ultra-fine pitch can be prepared according to any one of Examples 1-6.

With regard to the method provided herein for forming the interconnect structure for semiconductors with an ultra-fine pitch, the copper nanoparticles are prepared by vapor deposition, and the coupling parameters of the vapor deposition device are adjusted to control the particle size of the copper nanoparticles; the copper nanoparticles are deposited on the substrate, and then the chip with copper pillars as I/O ports is invertedly placed on the deposition area of the substrate, and then the chip and the substrate are bonded by heat-pressing sintering. In the method provided herein, the copper nanoparticles produced by the vapor deposition device has controllable particle size and high purity, and compared to the chemical preparation, the vapor deposition is free of toxic and environmentally polluting chemical substances, such as precursors, solvents or reducing agents, thereby avoiding the attenuation of the sintering performance caused by the organic residues and improving the device reliability. In addition, the method provided herein is suitable for any conductive materials including semiconductors due to its high flexibility, and can prevent the oxidization of the copper nanoparticles during the storage. Moreover, the positioning accuracy between the ultra-fine pitch chip and the substrate pad is greatly enhanced, and thus the high-density packaging and interconnection can be achieved.

The technical principle of this disclosure has been illustrated with reference to the above examples. Described above are merely descriptive of this disclosure, which should not be understood as limitations to this disclosure. It should be understood that based on the content provided herein, other embodiments obtained by those skilled in the art without paying any creative effort should still fall within the scope of the present application defined by the appended claims.

What is claimed is:

1. A method for forming an interconnect structure for semiconductors with an ultra-fine pitch, comprising:
    preparing copper nanoparticles by vapor deposition using a vapor deposition device; wherein a coupling parameter of the vapor deposition device is adjusted to control an initial particle size of the copper nanoparticles;
    transferring the copper nanoparticles from the vapor deposition device to a collection device; and depositing the copper nanoparticles in a deposition area of a substrate, a complete layer of nano-copper film is formed on the substrate by vapor deposition, the nano-copper film covers both interconnection I/O and locations free of interconnection;
    invertedly placing a chip with copper pillars as I/O ports on the deposition area of the substrate; and subjecting the copper pillars to hot-pressing sintering to allow the chip to be bonded with the substrate, so as to obtain a semi-finished interconnect structure;
    oxidizing the copper nanoparticles in areas not in contact with the copper pillars into copper oxide particles; and
    cleaning the semi-finished interconnect structure to remove the copper oxide particles, so as to obtain the interconnect structure.

2. The method of claim 1, wherein the transferring of the copper nanoparticles from the vapor deposition device to the collection device is performed in a protective gas under the action of an external electric field.

3. The method of claim 2, wherein the protective gas is nitrogen gas, argon gas or helium gas mixed with 5% or less of a reducing gas, and the reducing gas is hydrogen gas, formaldehyde gas or carbon monoxide.

4. The method of claim 3, wherein the initial particle size of the copper nanoparticles is smaller than 20 nm; and
  the protective gas is fed into the vapor deposition device at a flow rate of 0.5-5 L/min.

5. The method of claim 1, wherein the vapor deposition is performed by vacuum evaporation, magnetron sputtering, spark ablation-impacting deposition or ion planting.

6. The method of claim 1, wherein the hot-pressing sintering is performed through a step of:
  under the exposure to heat, laser, electromagnetic wave or ultrasonic wave, pressing the chip and the substrate by a clamp in combination with sintering to enable bonding between the chip and the substrate.

7. The method of claim 1, wherein the copper nanoparticles are oxidized through exposure to an oxidative fluid;
  wherein the oxidative fluid is hot air, oxygen or hydrogen peroxide.

8. The method of claim 7, wherein the step of "cleaning the semi-finished interconnect structure to remove the copper oxide particles" is performed through steps of:
  according to particle size of the copper nanoparticles deposited on the substrate and a thickness of a copper layer formed by hot-pressing sintering, cleaning the semi-finished interconnect structure with a 5%-10% (w/w) dilute sulfuric acid to remove the copper oxide particles from the deposition area of the substrate, and then with absolute ethyl alcohol to remove excess dilute sulfuric acid.

9. The method of claim 1, wherein the oxidization is performed through a step of:
  subjecting the semi-finished interconnect structure to baking in an oven to oxidize the copper nanoparticles.

10. An interconnect structure for semiconductors with an ultra-fine pitch, wherein the interconnect structure is formed by the method of claim 1.

* * * * *